United States Patent
Colunga et al.

(10) Patent No.: US 7,272,767 B2
(45) Date of Patent: Sep. 18, 2007

(54) METHODS AND APPARATUS FOR INCORPORATING IDDQ TESTING INTO LOGIC BIST

(75) Inventors: Tomas V. Colunga, Tempe, AZ (US); Loren J. Benecke, Mesa, AZ (US); Sribhaskar Mahadevan, Chandler, AZ (US); Joseph S. Vaccaro, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 190 days.

(21) Appl. No.: 11/117,893

(22) Filed: Apr. 29, 2005

(65) Prior Publication Data

US 2006/0248424 A1   Nov. 2, 2006

(51) Int. Cl.
*G01R 31/30* (2006.01)

(52) U.S. Cl. ............... 714/745; 714/738; 714/741; 714/732; 714/724; 714/718; 324/765; 365/201

(58) Field of Classification Search ............... None
See application file for complete search history.

(56) References Cited

U.S. PATENT DOCUMENTS

| | | | | |
|---|---|---|---|---|
| 5,712,857 | A * | 1/1998 | Whitman et al. | 714/724 |
| 5,790,565 | A * | 8/1998 | Sakaguchi | 714/738 |
| 5,844,909 | A * | 12/1998 | Wakui | 714/704 |
| 6,041,429 | A * | 3/2000 | Koenemann | 714/738 |
| 6,205,559 | B1 * | 3/2001 | Sakaguchi | 714/25 |
| 6,380,753 | B1 * | 4/2002 | Iino et al. | 324/765 |
| 6,441,633 | B1 * | 8/2002 | Manhaeve et al. | 324/763 |
| 6,836,867 | B2 * | 12/2004 | Yonetoku | 714/738 |
| 7,036,064 | B1 * | 4/2006 | Kebichi et al. | 714/744 |
| 2003/0154433 | A1 * | 8/2003 | Wang et al. | 714/726 |
| 2004/0230884 | A1 * | 11/2004 | Rajski et al. | 714/742 |
| 2005/0034041 | A1 * | 2/2005 | Casarsa | 714/733 |

OTHER PUBLICATIONS

Makar et al., "IDDQ Test Pattern Generation for Scan Chain Latches and Flip-Flops," Center for Reliable Computing, Stanford University.

Chakraborty et al., "Enhanced Controllability for IDDQ Test Sets Using Partial Scan," 28th ACM/IEEE Design Automation Conference, Paper 18.2, pp. 278-281.

Makar et al., "IDDQ Test Pattern Generation for Scan Chain Latches and Flip-Flops," Center for Reliable Computing, Stanford Univeristy. Nov. 1997.

Chakraborty et al., "Enhanced Controllability for IDDQ Test Sets Using Partial Scan," 28th ACM/IEEE Design Automation Conference, Paper 18.2, pp. 278-281. 1991.

* cited by examiner

*Primary Examiner*—Guy Lamarre
*Assistant Examiner*—John P Trimmings
(74) *Attorney, Agent, or Firm*—Ingrassia Fisher & Lorenz

(57) ABSTRACT

Built-in self test (BIST) capabilities are expanded to provide IDDQ testing of semiconductor chips. Conventional BIST modules generate vectors from a set of pseudo-random pattern generator (PRPG) values. The pseudo-random vectors generated by the set of PRPG values are simulated, and those vectors best suited for an IDDQ test are selected. Each of the IDDQ vectors are identified in a test pattern. During subsequent testing, an IDDQ test of the semiconductor chip can be performed whenever the current test vector applied by the logic BIST corresponds to one of the predetermined IDDQ states. A single test pattern based upon vectors generated by the logic BIST module can therefore be used to perform both IDDQ and stuck-at testing.

16 Claims, 3 Drawing Sheets

METHODS AND APPARATUS FOR INCORPORATING IDDQ TESTING INTO LOGIC BIST

TECHNICAL FIELD

The present invention generally relates to semiconductor chip testing, particularly testing of semiconductor chip logic using logic built-in self test (BIST) features.

BACKGROUND

Chip manufacturers continually strive to improve the quality and reliability of their products. In recent years, so-called "design for test" (DFT) practices that incorporate testing mechanisms into the design of a semiconductor chip have become prevalent in the semiconductor industry. In particular, many semiconductor chips are now designed to incorporate so-called "scan chains" wherein logic components (e.g. transistors, logic circuits) are interconnected such that a testing vector applied at the beginning of the chain propagates through each of the interconnected devices. The output signal received from the end of the scan chain can then be compared against an expected value to determine if any faults exist in the scan chain. In the widely-adopted "stuck at" test, for example, a testing vector is applied to a scan chain for identifying devices within the chain that are acting as if they are "stuck at" a logic low ("0") or high ("1") value. Vectors are also applied to the scan chains during "IDDQ" testing, which typically measures changes to the quiescent supply current provided to the device under test. Other testing techniques that can apply logic vectors to scan chains include "AC" tests that isolate chip faults relating to timing issues based upon dynamic transition errors, and the like.

Using traditional automatic test pattern generation (ATPG) techniques, an external testing device typically applies input vectors to the scan chains and reads the resulting outputs via interface pins on the semiconductor chip. This technique allows for relatively high flexibility in applying deterministic signals, controlling the speed of the test and processing the received data. IDDQ tests, in particular, have been historically best suited to external application due to the relative delays in measuring supply current. Externally testing devices can be complicated and expensive, however, and can require that additional test interface pins be built into certain chips for adequate testing. Moreover, the time for an external tester to conduct a thorough test of a chip can be undesirably long, leading many engineers to seek faster testing alternatives.

As a result, many chips now incorporate built-in self test (BIST) modules that internally generate pseudo-random vectors, apply the vectors to the scan chains, and receive a result that can be evaluated. Internal BIST testing is generally very fast compared to externally-applied testing, but can be somewhat limited in flexibility. In particular, the vectors available at any particular time can be somewhat limited to those produced by the pseudo-random pattern generator (PRPG) in the logic BIST. Because the ability to control the vectors and the timing of the logic BIST testing is somewhat reduced in comparison to externally-applied testing, logic BIST testing is typically limited to stuck-at and AC-type tests.

As semiconductor chips and their associated manufacturing techniques become increasingly complex, however, it is becoming increasingly common to supplement conventional "stuck-at" testing with other tests (such as IDDQ) to increase the level of fault detection and therefore enhance the reliability of the device under test. These additional tests, however, are typically performed using complicated, expensive and time consuming external testing devices. Moreover, performing multiple tests on a chip typically involves separately generating and applying multiple distinct vector sets to the scan chains, thereby further complicating the test process and increasing the test time. As a result, it is desirable to formulate a technique for efficiently testing the logic contained within a semiconductor chip without adversely affecting test coverage. In addition, it is desirable to create a tool and a test device for implementing efficient and effective testing techiques. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

According to various exemplary embodiments, logic BIST functionality is expanded to provide vectors used in IDDQ testing. By identifying those vectors generated by the logic BIST that are suitable for IDDQ tests and subsequently performing IDDQ measurements when those vectors are generated, the logic BIST can be used to apply the vectors processed during IDDQ testing. As a result, both stuck-at and IDDQ testing can be performed during a single pass of the logic BIST test sequence, thereby reducing test time and improving efficiency. Further, because the logic vectors are applied internally using the logic BIST, the number of specialized logic pins used for testing can be reduced in many chip designs, further improving efficiency and reducing design and implementation costs. Additionally, by shifting IDDQ vector application to the logic BIST, the IDDQ test can be performed on less sophisticated (and therefore less expensive) automated test equipment than would otherwise be needed.

Figure 1:
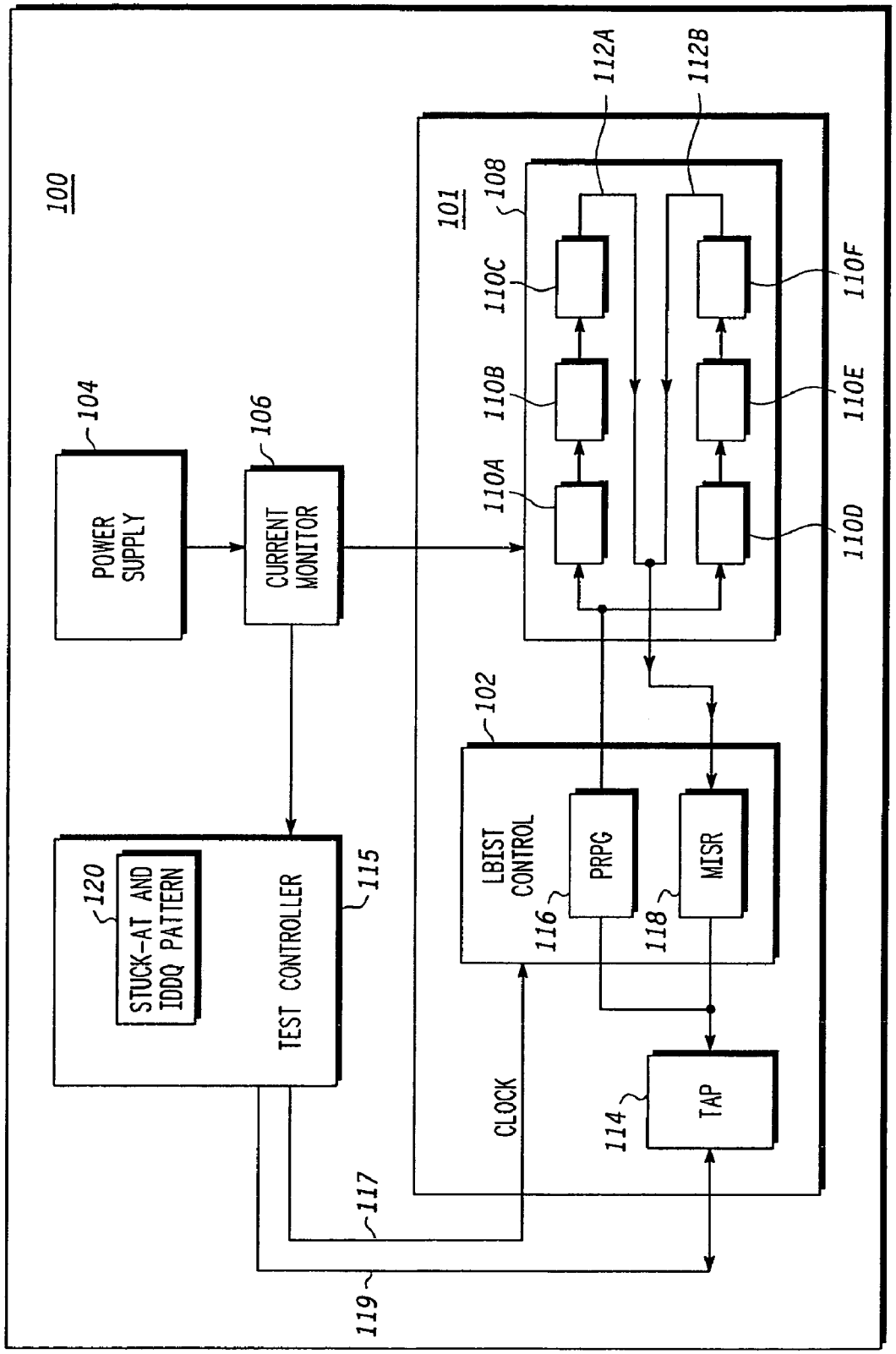
FIG. 1 is a block diagram of an exemplary test environment for semiconductor chips.

Turning now to the drawing figures and with initial reference to FIG. 1, an exemplary automated test equipment (ATE) system 100 for testing a semiconductor chip suitably includes a power supply 104, a current monitor 106 and a controller 115. Controller 115 suitably communicates with the semiconductor device under test (DUT) 101 to provide a testing clock signal 117 and any number of control signals 119 to implement the various tests desired. In various embodiments, controller 115 further maintains a test pattern 120 that contains a listing or other identification of certain logic vectors produced by a logic BIST module 102 in DUT 101 that are appropriate for IDDQ testing. When logic BIST module 102 produces one of the IDDQ vectors, controller 115 suitably obtains a measurement value from current monitor 106. Clock signal 117 may also be adjusted, if necessary, to provide additional time to conduct and receive the measurement value. By using the vectors applied by logic BIST 102 to perform both stuck-at and IDDQ testing, system 100 is able to efficiently yet effectively identify faults in DUT 101.

ATE system 100 may be implemented using any convenient test environment. In various embodiments, system 100 is implemented on a conventional circuit board capable of supporting and interconnecting the various components 104, 106 and 115, as well as providing an appropriate physical and electrical interface to DUT 101. Controller 115 may be implemented with any microcontroller, microprocessor and/or other programmable logic. In various embodiments, controller 115 includes (or has access to) digital memory and/or mass storage capable of storing software instructions for performing the various tests of DUT 101, and/or for storing test pattern 120 as described more fully below. Electrical power to DUT 101 is provided by any conventional power supply 104, which is coupled to DUT 101 via an appropriate current sensor circuit 106 to facilitate IDDQ testing. Current sensing may be provided by any conventional ATE primary measurement unit (PMU) and/or ATE digital power supply current measurement unit (DPSCMU) constructs commonly incorporated into many standard ATE devices. For many embodiments, however, the current sensing speed (and therefore test throughput) may be improved through the inclusion of an external current monitor. Various suitable monitors are commercially available including the model QD-100 current monitor product available from Q-STAR Test NV of Brugge, Belgium, or the like. Current sensing may be alternatively or additionally performed by any other monitors available from any other suppliers, by any custom-designed circuitry, and/or the like.

Device under test (DUT) 101 is any semiconductor chip or other component capable of undergoing stuck-at, IDDQ, AC and/or other vector-based fault tests. DUT 101 suitably includes an access port 114 for communicating with test controller 115, a logic BIST module 102, and one or more logic circuits 108 for testing. In various embodiments (e.g. "system on chip (SOC)" implementations), DUT 101 includes multiple distinct circuits 108 that are each separately testable from logic BIST module 102. Each logic circuit 108 includes any number of transistors, gates, logic elements or other components 110A-F interconnected in any manner to form any number of logic chains 112A-B. Logic chains 112A-B can be formed using any conventional technique presently known or hereafter developed.

Built-in self test module 102 is any module, circuit or other logic residing on DUT 101 capable of pseudo-randomly generating test vectors applied to scan chains 112A-B and of receiving output values from devices 108 in response. Various logic BIST modules 102 are readily incorporated into semiconductor chip designs using widely-available computer-aided design (CAD) tools such as the LBIST ARCHITECT tools available from Mentor Graphics Inc. of Wilsonville, Oreg., or the like. Many conventional logic BIST modules 102 include a pseudo-random pattern generator (PRPG) 116, which is any register or other circuit capable of producing pseudo-random vectors from a seed value. The seed value is typically stored within the PRPG register 116, and is referenced herein as a "PRPG value". The various vectors applied to scan chains 112A-B, then, are produced from the PRPG values maintained within logic BIST 102. Logic BIST 102 then initiates a functional cycle to capture the response of circuit 108. Results obtained from scan chains 112 are generally received at a multiple input signature register (MISR) 118, which suitably compresses the responses into a "signature" that can be subsequently processed and/or forwarded to test controller 115. The particular functions and features of logic BIST modules 102 will vary from embodiment to embodiment.

Access port 114 is any circuit, module or other interface capable of supporting the transfer of data between DUT 101 and test controller 115. In various embodiments, access port 114 is a test access port (TAP) configured in accordance with IEEE Standard 1149.1. This standard is commonly called the "JTAG" standard after the Joint Test Action Group that originally formulated the standard. The widely-available JTAG specification defines four signals corresponding to an input signal (TDI), an output signal (TDO), a test mode select signal (TMS) and a clock signal (TCK) that are typically used to test interconnectivity between chips operating on a common circuit board. Because the JTAG specification is so widely-implemented, a number of design tools are available that automate the creation of JTAG test access ports. This simplicity of design can be leveraged for other testing applications, such as those described herein, to create a four-pin access port 114 capable of fully inter-communicating with controller 115. Other embodiments, however, will use other access ports 114 that are modified from the JTAG standard, or that incorporate other standard or non-standard interfaces. Nevertheless, because the generation and application of test vectors is handled within DUT 101 rather than from an external source, the number of interface pins needed to allow inter-communication between logic BIST 102 and controller 115 is generally relatively low compared to prior implementations. Although FIG. 1 shows clock signal 117 as being separate from the other control signals 119, in practice clock 117 may be provided as part of signals 119 via access port 114 (e.g. using the JTAG TCK pin), or in any other manner.

In operation, then, controller 115 suitably interacts with logic BIST module 102 using control signals 119 to implement both stuck-at and IDDQ tests using vectors generated by logic BIST 102. As PRPG values corresponding to vectors suitable for IDDQ tests are produced by BIST module 102, controller 115 identifies these values from pattern 120 and obtains a current measurement from current monitor 106 as appropriate. In this manner, vectors already applied to logic 108 via BIST 102 for stuck-at tests can be used to implement IDDQ testing, thereby providing increased test coverage for DUT 101. Additional detail about an exemplary testing process is provided below in conjunction with FIG. 4.

Figure 2:
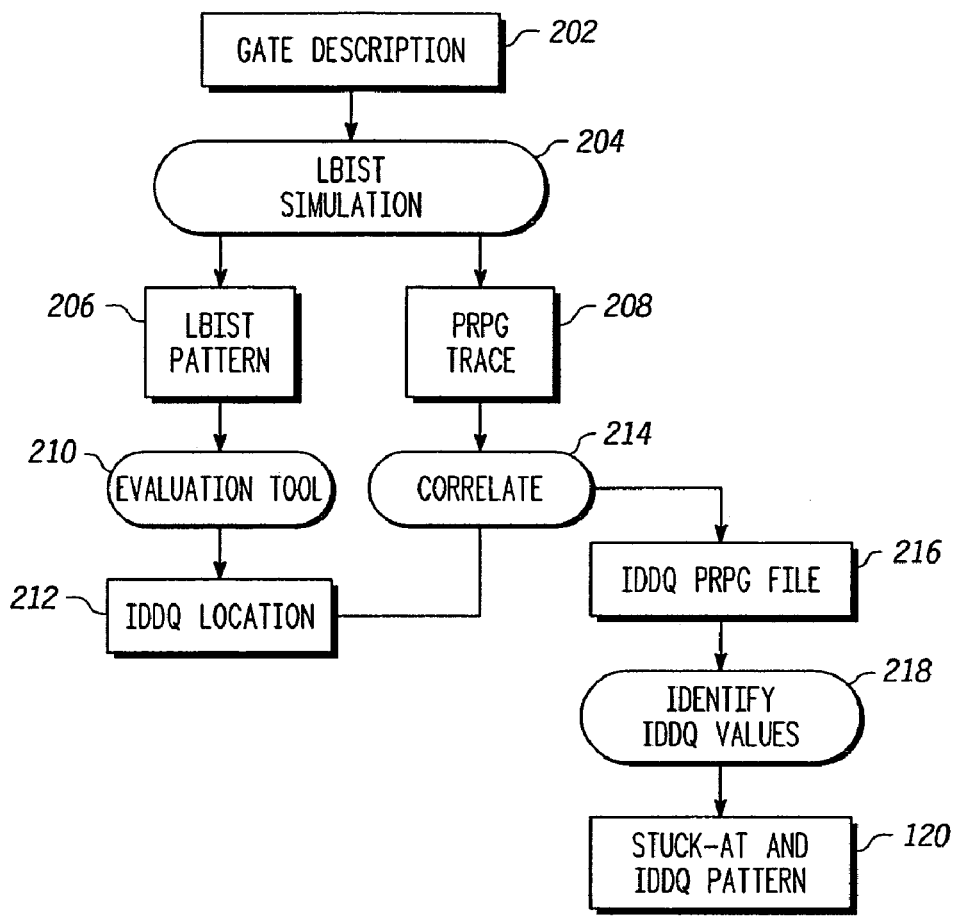
FIG. 2 is a logic diagram of an exemplary process for creating a test pattern suitable for use in both stuck-at and IDDQ testing.

FIG. 2 is a data flow diagram that shows the interplay of various processing modules during an exemplary process for creating a test pattern with combined BIST and IDDQ vectors. Referring now to FIG. 2, test pattern 120 can be created by simulating the logic BIST (204) to identify vectors generated by various PRPG values, evaluating the vectors generated (210) to select those most compatible with IDDQ testing, correlating the selected vectors (214) to the PRPG values used to generate them, and identifying the IDDQ vectors (218) to create a test pattern 120 suitable for use in simultaneous stuck-at and IDDQ testing.

Modem chip design is typically performed using automated CAD tools that generate an electronic gate description 202 that can be further processed to generate test pattern 120. Using the gate description 202, for example, logic BIST module 102 can be simulated (204) to identify vectors that would be produced by various values present in PRPG 116. Simulator 204 may also identify the values for MISR 118 that would be expected to result from each of the vectors produced during a stuck-at or similar test. The LBIST ARCHITECT FAULTSIM program available from Mentor Graphics Corp., for example, provides the ability to model portions of chip designs, including the ability to generate vector patterns produced in response to various PRPG values. The vectors produced may be stored in a table or other listing 206, for example, and may be indexed according to trial number or any other appropriate index value. The PRPG values used to generate the vectors in listing 206 may be further provided in a separate listing 208 that is also indexed by trial number or the like. In alternate embodiments, listings 206 and 208 may be combined to form a single table that incorporates vector data, PRPG values and any other information (e.g. expected MISR signatures) as appropriate. MISR signatures may be alternatively provided in listing 206, in listing 208, and/or in a separate listing.

Conventional ATPG techniques typically produce separate vector patterns for stuck-at and IDDQ tests using a software tool that also controls external application of the vectors during each test. An example of such a tool is the FASTSCAN application available from Mentor Graphics, although other programs could be used to provide similar functionality. Rather than relying upon the ATPG application to generate vectors, however, vector set 206 can be provided to an ATPG or similar tool 210 to evaluate and select those vectors that are compatible with IDDQ testing. ATPG tool 210 typically grades the total set of scan trials produced to determine the effectiveness of the IDDQ test, and may also identify optimal (or more preferred) vectors from the total set of scan trials. These selected IDDQ vectors 212 represent locations within vector space 206 that are most suited for performing IDDQ tests, and may be stored in an output file or the like in conjunction with the simulation trial number or other index value referenced above.

The IDDQ vectors 212 are then correlated to the PRPG values 208 used to generate those vectors in any manner. Correlation may take place in any manner, including any manual or automatic correlation based upon the trial number or other index value stored in listings 208 and/or 212. In an exemplary embodiment, a PERL or similar script can be readily created to automate the correlation process. The correlation step therefore results in a table or other listing 216 of PRPG values produced by logic BIST 102 that produce vectors suitable for IDDQ testing.

The PRPG values used in IDDQ testing can then be identified within test pattern file 120 provided to ATE system 100. Identification may take place in any manner. The operation of DUT 101 may be simulated to create a test pattern using conventional techniques, for example, with comments, flags or other indicators inserted into the test pattern to identify the PRPG values that result in IDDQ vectors. The simulation may be executed by any software application 218 such as the VERILOG COMPILED SIMULATOR (VCS) simulation tool available from Synopsys Corporation of Mountain View, Calif.

Figure 3:
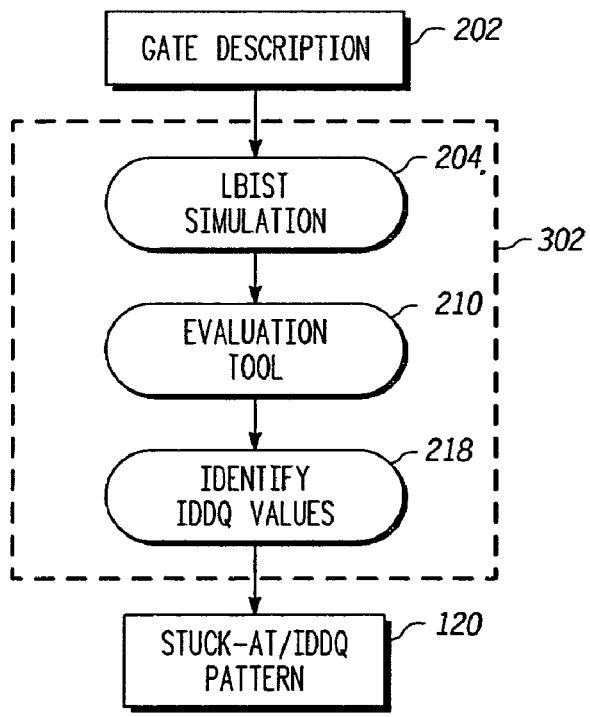
FIG. 3 is a block diagram of an exemplary software application for creating test patterns suitable for hybrid stuck-at and IDDQ testing.

Test pattern 120 may be alternatively created in any manner, and may take any standard or non-standard format. FIG. 3, for example, shows a hybrid software tool 302 that combines the LBIST simulation 204, vector evaluation 210 and PRPG identification 218 features described above. The various components of process 200 can be automated, combined or otherwise organized in any manner, and may therefore be implemented in any software, hardware and/or hybrid manner using any programming language residing upon any memory, mass storage device, transportable media or the like. Accordingly, any pattern 120 capable of identifying PRPG values generated within logic BIST 102 that are suitable for performing IDDQ tests could be used in any number of alternate but equivalent embodiments.

Figure 4:
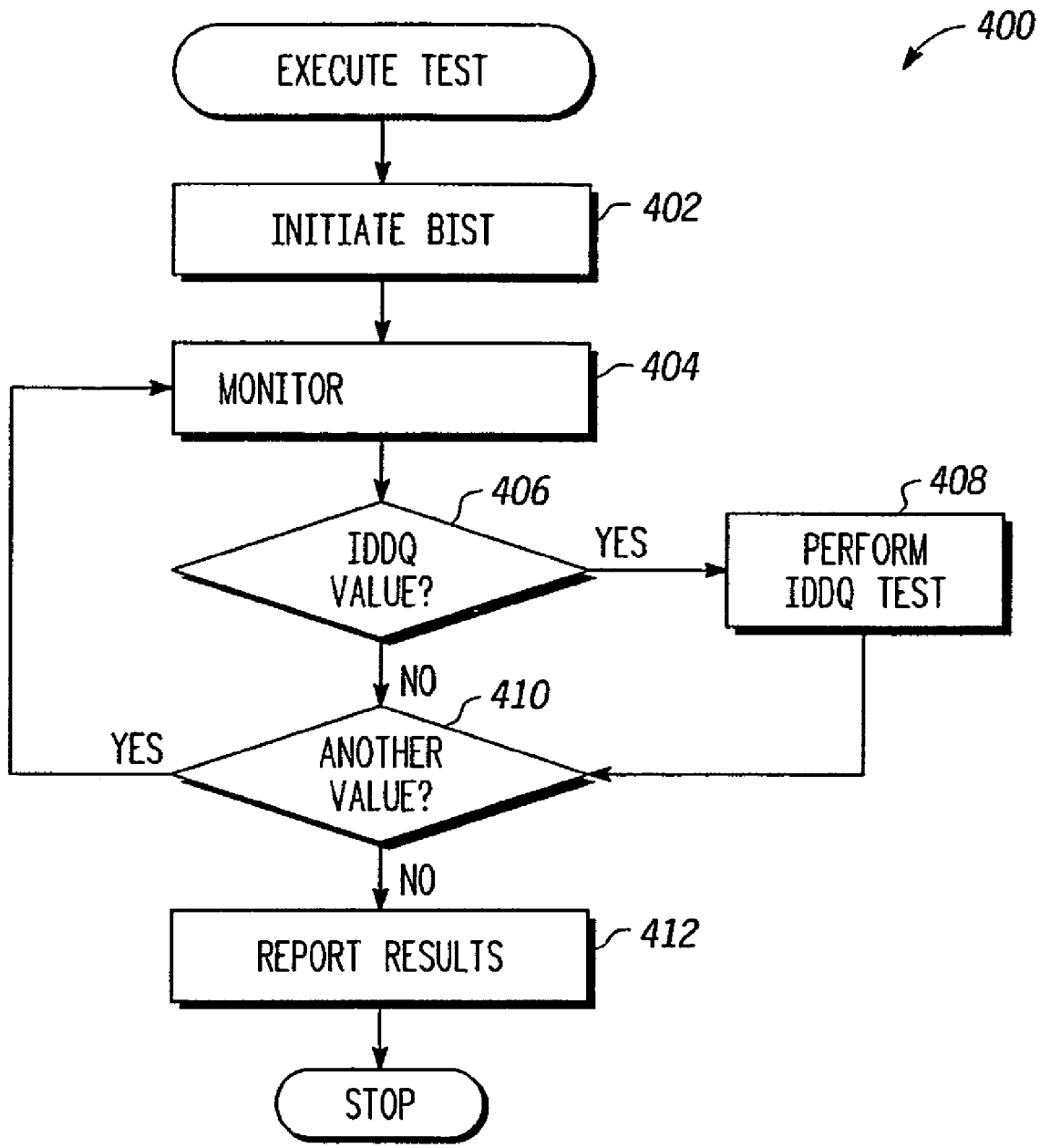
FIG. 4 is a flowchart of an exemplary process for performing simultaneous stuck-at and IDDQ testing with a logic BIST module.

The identified PRPG values that produce IDDQ vectors can be processed within ATE system 100 in any manner. In various embodiments, controller 115 (FIG. 1) executes a software test routine that is stored within memory and/or any other digital storage medium. With reference now to FIG. 4, an exemplary process 400 suitable for implementing a hybrid stuck-at/IDDQ test by ATE system 100 suitably includes the broad steps of monitoring a current vector applied by the logic BIST module (step 404) and performing an IDDQ test of the semiconductor chip using the current test vector applied by the logic BIST when the applied vector corresponds to one of the predetermined IDDQ states (step 408).

ATE system 100 suitably begins process 400 by initializing the logic BIST module 102 (step 402). This step may include providing a "seed" value for generating pseudo-random numbers, or may simply involve providing an instruction (e.g. via signals 119) to begin executing the self-test. System 100 thereafter monitors the test vectors applied by the logic BIST 102 in any manner (step 404). Monitoring may involve receiving an indication of the value from logic BIST 102, for example, or may simply involve monitoring an index value or the like in test pattern 120 to track the progress of PRPG 116 (and/or the vectors produced thereby) as the logic BIST advances through the pseudo-random test. Monitoring step 404 therefore involves monitoring the progress of the applied vector in any manner that allows IDDQ measurements to be performed when the appropriate IDDQ vectors are applied by logic BIST 102.

Controller 115 suitably obtains a current measurement from monitor 106 when the appropriate vector is applied by BIST module 102 (step 406). When the value of the applied test vector matches one of the identified IDDQ values in test pattern 120, controller 115 suitably performs an IDDQ measurement (step 408) in any manner. Performing the current measurement may involve activating current monitor 106 and/or temporarily delaying clock signal 117 to provide additional time for obtaining a current measurement, although the need for this delay and the length of any applied delay will vary significantly from embodiment to embodiment. Although it may be possible in some embodiments to obtain current measurements on a relatively constant basis (i.e. for most or all of the vector values in test pattern 120), the time to execute a complete test can be reduced significantly by simply obtaining current measurements for only those vectors associated with "graded" IDDQ testing that provide sufficient (or optimal) fault detection.

Processing continues as appropriate until each of the vectors represented in test pattern 120 have been executed (step 410). After each of the vectors in test pattern 120 have been applied and evaluated, ATE system 100 may provide a report 412 of results obtained. The report may include a simple "pass/fail" indication, for example, or may include more detailed results of the stuck-at and/or IDDQ tests. Reporting may take place in any manner, such as via a visual and/or audio readout to a technician, a digital report provided to an external computer or other host, or the like.

Because the vectors used in the test are produced by logic BIST module 102, a single pass through the pseudo-randomly generated vectors can be used to produce both stuck-at and IDDQ fault detection. Testing parameters or criteria can vary from embodiment to embodiment, however, depending upon the particular goals of the test. The faults associated with a design 101 can be "double tested" by stuck-at testing as well as IDDQ testing for a single vector set, for example. This double-testing allows for improved detection of design faults, thereby increasing the robustness of the test. Alternatively, a single vector set can be developed such that the IDDQ component focuses on untested stuck-at faults to reduce the time of the overall testing process. Other modifications to the testing process could also be performed.

Various exemplary embodiments include, without limitation, the following:

In one embodiment, a method is provided for creating a test pattern for use in testing a semiconductor chip having a built-in self-test (BIST) module configured to generate a plurality of vectors from a set of pseudo-random pattern generator (PRPG) values. A plurality of pseudo-random vectors to be generated by the set of PRPG values are simulated, and a plurality of IDDQ vectors compatible with an IDDQ test from the plurality of pseudo-random vectors are identified. The plurality of IDDQ vectors are then identified in the test pattern to thereby facilitate IDDQ testing of the semiconductor chip using the vectors applied by the BIST module.

In various further embodiments of the method, each of the plurality of pseudo-random vectors represents a vector applied in a stuck-at test of the semiconductor chip. The simulating step may comprise determining a signature value for each of the plurality of pseudo-random vectors corresponding to an expected result from the application of the vector in the stuck-at test of the semiconductor chip. The test pattern may be further configured to facilitate both stuck-at and IDDQ testing with a common set of PRPG values. The simulating step may comprise generating a first listing of vector values for each of the plurality of pseudo-random vectors and a second listing of PRPG values used to create the vector values. The selecting step may comprise evaluating each of the vector values in the first listing. Additionally, each of the plurality of IDDQ vectors may be correlated to the PRPG value in the second listing that was used to generate the IDDQ vector in the simulating step. The selecting step may comprise optimizing the plurality of IDDQ vectors. The identifying step may comprise simulating the operation of the semiconductor chip.

In other embodiments, a method of testing a semiconductor chip having a built-in self test (BIST) module configured to generate test vectors applied to the semiconductor chip are described. A current state of the test vector applied by the logic BIST module is monitored, and an IDDQ test of the semiconductor chip is performed using the current test vector applied by the logic BIST if the current state corresponds to one of a plurality of predetermined IDDQ states. The monitoring and performing steps are repeated for each of the test vectors.

This method may be modified or enhanced in various ways. For example, the monitoring and performing steps may be practiced by a test device in communication with the BIST module. The performing step may further comprise not performing the IDDQ test if the current test vector does not correspond to one of the plurality of predetermined IDDQ states. An additional step of providing a report after each of the test vectors are applied by the BIST module may also be performed, wherein the report comprises an indication of both stuck-at and IDDQ testing. In various further embodiments, the stuck-at and IDDQ testing are both performed during a single application of the set of test vectors. Further, the performing step may comprise temporarily delaying a clock signal applied to the BIST module while the IDDQ test is being performed.

Other embodiments include software programs and/or digital storage media having computer executable instructions stored thereon for executing any of the previously-described methods, as well as semiconductor chips tested with any of the previously-described methods.

In still other embodiments, a system for testing a semiconductor chip having a built-in self-test module configured to generate test vectors applied to the semiconductor chip comprises a power source configured to provide electrical power to the semiconductor chip, a current detector electrically located between the power source and the semiconductor chip, and a controller coupled to the current detector and to the semiconductor chip and configured to monitor a current state of the test vector applied by the logic BIST module and to interface with the current detector to perform an IDDQ test of the semiconductor chip when the current state of the test vector corresponds to one of a plurality of predetermined IDDQ states. The system may be further configured to interface with the semiconductor chip via an IEEE 1149.1 test access port interface, or the like.

Using the techniques and systems described above, significant improvements in test performance and effectiveness have been realized. Semiconductor chips that were previously evaluated with two separate vector sets corresponding to separate stuck-at and IDDQ tests, for example, have been evaluated with significantly fewer test vectors with no decrease in test effectiveness. Moreover, test time is significantly reduced by applying a single vector set with the internal BIST rather than an external tester, thereby further improving test efficiency.

While these and other exemplary embodiments have been presented in the foregoing detailed description, it should be appreciated that a vast number of alternate embodiments and equivalent variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method of creating a test pattern for use in testing a semiconductor chip having a built-in self-test module configured to generate a plurality of vectors from a set of pseudo-random pattern generator values, the method comprising the steps of:

simulating a plurality of pseudo-random vectors to be generated by the set of pseudo-random pattern generator values for use in a struck-at test of the semiconductor chip;

selecting a plurality of IDDQ vectors compatible with an IDDQ test from the plurality of pseudo-random vectors;

identifying the pseudo-random pattern generator values used to create each of the IDDQ vectors for inclusion in the test pattern; and providing the test pattern to thereby facilitate IDDQ testing of the semiconductor chip using the vectors generated by the built-in self-test module on the semiconductor chip.

2. The method of claim 1 wherein the simulating step comprises determining a signature value for each of the plurality of pseudo-random vectors corresponding to an expected result from the application of the vector in the stuck-at test of the semiconductor chip.

3. The method of claim 1 wherein test pattern is configured to facilitate both stuck-at and IDDQ testing with a common set of pseudo-random pattern generator values.

4. The method of claim 1 wherein the simulating step comprises generating a first listing of vector values for each of the plurality of pseudo-random vectors and a second listing of pseudo-random pattern generator values used to create the vector values.

5. The method of claim 4 wherein the selecting step comprises evaluating each of the vector values in the first listing.

6. The method of claim 1 wherein the selecting step comprises optimizing the plurality of IDDQ vectors.

7. The method of claim 1 wherein the identifying step comprises simulating the operation of the semiconductor chip.

8. A digital storage medium having computer-executable instructions stored thereon configured to execute the method of claim 1.

9. A method of testing a semiconductor chip having a built-in self test module configured to generate test vectors from pseudo-random numbers generated on the semiconductor chip, wherein the test vector comprise a plurality of predetermined IDDQ vector, the method comprising the step of:

monitoring a present test vector applied by the built-in self test module;

determining if the present test vector corresponds to one of the plurality of predetermined IDDQ vectors;

performing an IDDQ test of the semiconductor chip using the present test vector applied by the built-in self test module if the presented test vector corresponds to one of the plurality of predetermined IDDQ vectors; and repeating the monitoring, determining, and performing steps for each of the test vectors applies by the built-in self test module.

10. The method of claim 9 wherein the monitoring and performing steps are practiced by a test device in communication with the BIST module.

11. The method of claim 9 wherein the performing step comprises not performing the IDDQ test if the present test vector does not correspond to one of the plurality of predetermined IDDQ states.

12. The method of claim 9 further comprising the step of providing a report after each of the test vectors are applied by the BIST module, wherein the report comprises an indication of both stuck-at and IDDQ testing.

13. The method of claim 12 wherein the stuck-at and IDDQ testing are both performed during a single application of the set of test vectors.

14. The method of claim 9 wherein the performing step comprises temporarily delaying a clock signal applied to the BIST module while the IDDQ test is being performed.

15. A computer-readable medium encoded with a computer program, wherein the computer program is configured to implement the method of claim 12.

16. A system for testing a semiconductor chip having a built-in self-test module configured to generate test vectors applied to the semiconductor chip, the device comprising:

a power source configured to provide electrical power to the semiconductor chip;

a current detector electrically located between the power source and the semiconductor chip; and a controller coupled to the current detector and to the semiconductor chip and configured to monitor a state of the test vector applied by the built-in self test module in the semiconductor chip, to determine if the present test vector applied by the built-in self test module in the semiconductor chip corresponds to one of a plurality of predetermined IDDQ vectors, and to interface with the current detector to perform an IDDQ test of the semiconductor chip when the present test vector generated by the built-in self test module of the semiconductor chip corresponds to one of the plurality of predetermined IDDQ vectors.

* * * * *

UNITED STATES PATENT AND TRADEMARK OFFICE
CERTIFICATE OF CORRECTION

PATENT NO. : 7,272,767 B2 Page 1 of 1
APPLICATION NO. : 11/117893
DATED : September 18, 2007
INVENTOR(S) : Tomas V. Colunga et al.

It is certified that error appears in the above-identified patent and that said Letters Patent is hereby corrected as shown below:

Column 8, line 63, "struck" should be changed to --stuck--;

Signed and Sealed this

Fourth Day of December, 2007

JON W. DUDAS
*Director of the United States Patent and Trademark Office*